United States Patent
Piret et al.

(10) Patent No.: US 6,638,318 B1
(45) Date of Patent: Oct. 28, 2003

(54) METHOD AND DEVICE FOR CODING SEQUENCES OF DATA, AND ASSOCIATED DECODING METHOD AND DEVICE

(75) Inventors: Philippe Piret, Cesson-Sevigne (FR); Claude Le Dantec, Saint Hilaire des Landes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/434,402

(22) Filed: Nov. 5, 1999

(30) Foreign Application Priority Data

Nov. 9, 1998 (FR) ............................. 98 14086

(51) Int. Cl.[7] ........................................... H03M 13/00
(52) U.S. Cl. ...................................... 718/781
(58) Field of Search .................. 714/701, 781, 714/786, 791, 792, 746, 755

(56) References Cited

U.S. PATENT DOCUMENTS

| | | | | |
|---|---|---|---|---|
| 4,937,828 A | * | 6/1990 | Shih et al. ................... | 714/757 |
| 6,085,349 A | * | 7/2000 | Stein ........................ | 714/778 |
| 6,351,456 B1 | * | 2/2002 | Struhsaker et al. ......... | 370/280 |

FOREIGN PATENT DOCUMENTS

WO    WO 9738495    10/1997

OTHER PUBLICATIONS

Berrou et al., "Near Optimum Error Correcting Coding and Decoding: Turbo–Codes", IEEE Transactions on Communications, vol. 44, No. 10, 1996, pp. 1261–1271.

Benedetto et al., "Iterative Decoding of Serially Concatenated Codes with Interleavers and Comparison with Turbo Codes", IEEE Global Telecommunications Conf., vol. 2, 1997, pp. 654–658.

Barbulescu et al., "Interleaver Design for Turbo Codes", Electronics Letters, vol. 30, No. 25, 1994, p. 2107/2108.

Koora et al., "Interleavers Design for Turbo Codes with Selected inputs", Electronics Letters, vol. 34, No. 7, 1998, p. 651/652.

* cited by examiner

*Primary Examiner*—Christine T. Tu
(74) *Attorney, Agent, or Firm*—Fitzpatrick, Cella, Harper & Scinto

(57) ABSTRACT

The coding method to which the present invention relates takes into account:

- a polynomial without square $g(x)$,
- $N0$, the smallest integer such that $g(x)$ is a divisor of the polynomial $x^{N0}+1$;
- $n$, an odd multiple of $N0$;
- a sequence $u$ of $n$ symbols $u_i$ to be coded; and
- $e$, a power of 2 different from 1, which is residue of $e$ modulo $N0$ is equal to 1.

It includes:
- an operation of forming a concatenated sequence $uu^*$ (304) consisting successively of the sequence $u$ and a sequence of symbols $u^*$ such that $u^*(x)=u(x^e)$ modulo $x^n+1$,
- an operation of coding the concatenated sequence $uu^*$ (305), including at least one division of the concatenated sequence $uu^*$ by the polynomial $g(x)$.

23 Claims, 5 Drawing Sheets

Columns: 0                $N0-1$

| $u_0$ | $u_1$ | ... | $u_{N0-1}$ |
| $u_{N0}$ | $u_{N0+1}$ | ... | $u_{2N0-1}$ |
| ... | | | |
| $u$ | | | $u_n$ |
| | | | |

Fig. 1

METHOD AND DEVICE FOR CODING SEQUENCES OF DATA, AND ASSOCIATED DECODING METHOD AND DEVICE

The present invention concerns a coding device, a coding method, a decoding device and method and systems implementing them.

It applies equally well to the coding of data representing a physical quantity, to the coding of data in the form of codes able to modulate a physical quantity, to the decoding of data modulated signals, and to the decoding of data representing physical quantities. These data can, for example, represent images, sounds, computer data, electrical quantities or stored data.

The invention finds an application in the field of convolutional codes. When the latter are used for implementing an iterative decoding, these codes are greatly improved when their coders contain a permutation device. In this case, they are normally referred to as "turbocodes" and the corresponding iterative decoder is referred to as a "turbodecoder".

On these subjects, documents which serve as a reference are, on the one hand, the article by Messrs. C. BERROU, A. GLAVIEUX and P. THITIMAJSHIMA entitled "Near Shannon limit error-correcting coding and decoding turbocodes" published with the reports on the conference "ICC'93", 1993, pages 1064 to 1070, and on the other hand the article by Messrs. C. BERROU and A. GLAVIEUX entitled "Near Optimum error-correcting coding and decoding: turbo-codes" published by IEEE Transactions on Communication, Volume COM-44, pages 1261 to 1271, in October 1996.

However, the formation of permutation devices is as far from being perfectly mastered. In general this device uses square or rectangular matrices in which one line after another is written and one column after another is read. These matrices are generally very large, for example 256× 256 in size.

A turbocoder with an efficiency of ⅓ can be considered to be a pair of convolutional systematic coders using divisor polynomials. The first coder produces a check sequence from the sequence of symbols to be coded u and the second coder produces a check sequence from an interleaved sequence u* obtained by interleaving the sequence u. In this context, the return to zero of the two coders, simultaneously, is a classic problem.

A first manner of resolving this was described in the publication "Frame oriented convolutional turbo-codes", (C. BERROU et al.), Electronics Letters, Volume 32, No. 15, Jul. 18, 1996 p. 1362–1364, Stevenage, Herts, Great Britain.

Let the divisor polynomial of a turbocoder, that is to say of each elementary coder, be g(x). Let the degree of the polynomial g(x) be m and N0 the smallest integer such that g(x) is a divisor of the polynomial $x^{N0}+1$. Let also n be a multiple of N0: n=M N0.

In order to disclose the content of this publication, the sequence of symbols to be coded will be represented as a sequence of polynomials $u(x)=\Sigma_{i=0 \text{ to } n-1} u_i x^i$. Thus each polynomial u(x) contains n binary symbols to be coded.

Let then u(x) be written as $$u(x)=\Sigma_{j=0 \text{ to } N0-1} s_j(x^{N0}) x^j.$$

where each polynomial $s_j(x)$ has a degree M−1.

With regard to FIG. 1, it will be understood that this set of writings can be represented as follows:

in a table 101 having N0 columns, the symbols $u_i$ of the sequence u, are entered, row by row, from left to right and starting from the highest line and going towards the lowest line in the table;

the polynomials $S_j(x)$ are polynomials whose coefficients of increasing rankings are the symbols which are situated in the $j^{th}$ column in the table, entered, in order, from top to bottom.

Let $S^*_j(x)$ then be another polynomial of degree M−1 obtained from $S_j(x)$ by permutation of its coefficients. For different values of j, the permutations producing $S^*_j(x)$ from $S_j(x)$ can be different.

In the table 101 considered above, this amounts to stating that the coefficients of the polynomial $S^*_j(x)$ are those of the $j^{th}$ column in the table, but in a different order from the coefficients of the polynomial $S_j(x)$.

If the table 102 corresponding to the polynomials $S^*_j(x)$ is written in the same way as the table 101 corresponds to the polynomials $S_j(x)$, by juxtaposing the last line in the table 101 and the first in the table 102, is found that each coefficient which is situated in the $j^{th}$ column in the table 101 is situated in the $j^{th}$ column in the table 102.

Let then $u^*(x)=\Sigma_{j=0 \text{ to } N0-1} S^*_j(x^{N0}) x^i$ be written and let:

i $uu^*(x)=u(x)+x^n u^*(x)$ be defined.

It is easy to show that uu*(x) is divisible by g(x). Therefore the coding of u(x) as v=[u, uu*/g] is possible with an exact division. The efficiency R of this coding is then given by R=nl(3n−m).

A second way of resolving the problem of the return to zero of the coder has been found by the inventors and is summarised below.

Let g(x) be the divisor polynomial of a turbocoder, that is to say of each coder. Let m be the degree of the polynomial g(x) and N0 the smallest integer such that g(x) is a divisor of the polynomial $x^{N0}+1$. For reasons described below, g(x) is considered to be a "polynomial without square" and this means that N0 is an odd number.

Let also n be an odd multiple of N0: n=M N0.

A sequence of symbols u, of length n'=n−m, then has a polynomial representation u(x), of degree n−m−1, with binary coefficients, and this polynomial u(x) is precoded as:

$$a(x)=u(x)+\Sigma_{i=n-m}^{n-1} a_i x^i$$

where the m symbols $a_i$ are chosen so that a(x) is a multiple of g(x). In consequence of this precoding, if a(x) is a multiple of g(x), then $a^*(x)=a(x^e)$ modulo $x^n+1$ is also a multiple of g(x) for any value of e which is a power of 2.

In the remainder of the description, this type of interleaver and, by extension, the type of turbocoders which implement them, is called "x to $x^e$".

Here it is necessary to consider that g(x) has no multiple factor because, in general, a*(x) has the guarantee of being divisible solely by the irreducible factors of g(x).

The coded version of u is then given by v=[a, $ah_1/g$, $a^*h_2/g$] where all the components are polynomials, and where, in particular, $a^*h_2/g$ is also a polynomial, by virtue of the definition of a* and the choice of e as a power of 2.

The present invention aims to exploit conjointly the advantages of the teachings of the approaches mentioned above.

To this end, according to a first aspect, the present invention relates to a coding method, characterised in that:

1/ it takes into account:
 a "polynomial without square" g(x),
 N0, the smallest integer such that g(x) is a divisor of the polynomial $x^{N0}+1$;
 n, an odd multiple of N0;
 a sequence u of n symbols $u_i$ to be coded; and e, a power of 2 different from 1, for which the residue of e modulo N0 is equal to 1, 2/ it includes:
an operation of forming a so-called "concatenated" sequence uu* consisting successively, on the one hand, of the sequence of symbols u, having n symbols, and on the other hand a sequence of symbols u* defined by its polynomial representation, $u^*(x)=u(x^e)$ modulo $x^n+1$, an operation of coding the concatenated sequence, including at least one division of the concatenated sequence uu* by the polynomial g(x) in order to form a so-called "check" sequence.

Thus the present invention consists of using, as a specific interleaver, in the coding scheme disclosed in the publication by C. BERROU et al., interleavers identical to those used by the inventors and presented above, of the type "x to $x^e$", for which the residue of e modulo N0 is equal to 1.

The advantages of the present invention are as follows:
It describes a specific non-trivial way for implementing the idea of the publication by C. BERROU;
provision is made for the regular structure of the interleaver which is the object of the present invention to have favourable effects on the type of residual error after decoding;
implementation of the invention is particularly simple since merely the knowledge of the values of n and e suffices.

According to particular characteristics, the coding method to which the present invention relates, and as briefly disclosed above, includes an operation of transmitting the sequence to be coded u and the check sequence resulting from the operation of coding the concatenated sequence.

By virtue of these provisions, the transmitted sequence can be received, even if the transmission channel used is relatively noisy.

According to particular characteristics, the coding method to which the present invention relates, and as briefly disclosed above, includes an operation of transmitting the sequence to be coded u and part of the check sequence resulting from the operation of coding the concatenated sequence.

By virtue of these provisions, the efficiency of the coding method is improved.

According to a second aspect, the present invention relates to a decoding method, characterised in that:

1/ it takes into account:
a "polynomial without square" g(x),
N0, the smallest integer such that g(x) is a divisor of the polynomial $x^{N0}+1$;
n, an odd multiple of N0;
e, a power of 2 different from 1, for which the residue of e modulo N0 is equal to 1, 2/ it includes an operation of receiving signals representing:
a coded sequence u of n symbols $u_i$; and
the result of the division by g(x) of a so-called "concatenated" sequence uu* consisting successively, on the one hand, of the sequence of symbols u, including n symbols, and on the other hand a sequence of symbols u* defined by its polynomial representation, $u^*(x)=u(x^e)$ modulo $x^n+1$, 3/ it includes a decoding operation including the use of the polynomial g(x).

According to a third aspect, the present invention relates to a coding device, characterised In that it has a processing means adapted:

1/ to take into account:
a "polynomial without square" g(x),
N0, the smallest integer such that g(x) is a divisor of the polynomial $x^{N0}+1$;
n, an odd multiple of N0;
a sequence u of n symbols $u_i$ to be coded; and
e, a power of 2 different from 1, for which the residue of e modulo N0 is equal to 1, 2/ to form a so-called "concatenated" sequence uu* consisting successively, on the one hand, of the sequence of symbols u, including n symbols, and on the other hand a sequence of symbols u* defined by its polynomial representation, $u^*(x)=u(x^e)$ modulo $x^n+1$, 3/ to code the concatenated sequence by effecting at least one division of the concatenated sequence uu* by the polynomial g(x) in order to form a so-called "check" sequence.

According to a fourth aspect, the present invention relates to a decoding device, characterised in that:

1/ it has a processing means to take into account:
a "polynomial without square" g(x),
N0, the smallest integer such that g(x) is a divisor of the polynomial $x^{N0}+1$;
n, an odd multiple of N0;
e, a power of 2 different from 1, for which the residue of e modulo N0 is equal to 1, 2/ it has a means of receiving signals representing:
a coded sequence u of n symbols $u_i$; and
the result of the division by g(x) of a so-called "concatenated" sequence uu* consisting successively, on the one hand, of the sequence of symbols u, including n symbols, and on the other hand a sequence of symbols u* defined by its polynomial representation, $u^*(x)=u(x^e)$ modulo $x^n+1$, 3/ the processing means is adapted to decode the sequence u using the polynomial g(x).

The invention also relates to:
an information storage means which can be read by a computer or a microprocessor storing instructions of a computer program, characterised in that it makes it possible to implement the method of the invention as briefly disclosed above, and a partially or totally removable information storage means which can be read by a computer or a microprocessor storing instructions of a computer program, characterised in that it makes it possible to implement the method of the invention as briefly disclosed above.

The invention also relates to:
a device for processing signals representing speech, which includes a device as briefly disclosed above,
a data transmission device having a transmitter adapted to implement a packet transmission protocol, which includes a device as briefly disclosed above,
a data transmission device having a transmitter adapted to implement the ATM (Asynchronous Transfer Mode) packet transmission protocol, which includes a device as briefly disclosed above,
the data transmission device having a transmitter adapted to implement the packet transmission protocol on a network of the ETHERNET (registered trade mark) type,
a network station, which has a device as briefly disclosed above,
a data transmission device including a transmitter transmitting over a wireless channel, which includes a device as briefly disclosed above, and a device for processing sequences of signals representing at most one thousand binary data, which includes a device as briefly disclosed above.

Since these coding and decoding devices, these coding and decoding methods and these signal processing, data transmission and sequence processing devices and this network have the same particular characteristics and the same advantages as the coding method as briefly disclosed above, these particular characteristics and these advantages are not repeated here.

Other advantages, aims and characteristic of the present invention will emerge from the following description, given with regard to the accompanying drawings, in which:

FIG. 1 depicts schematically the teachings of the document of C. BERROU et al.;

Figure 1:
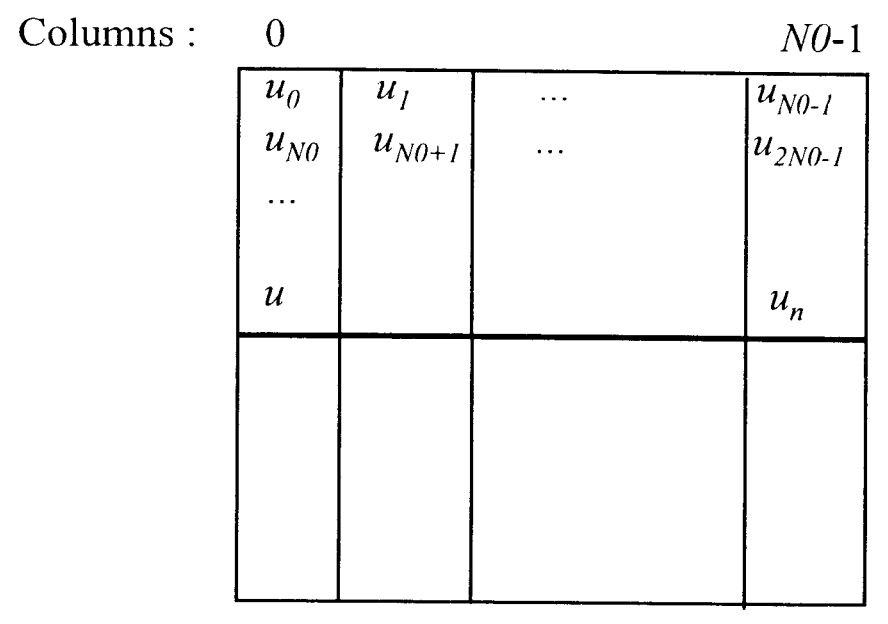

FIG. 1 has already been described with regard to the explanation of the teachings of the document of C. BERROU et al., above.

The mathematical bases of the present invention will now be disclosed.

Let:

$g(x)$ be the divisor polynomial of a turbocoder;

$N0$ be the smallest integer such that $g(x)$ is a divisor of the polynomial $x^{N0}+1$; and $n$ be an odd multiple of $N0$: $n=M\ N0$.

$g(x)$ being a "polynomial without square divisor", $N0$ is an odd number.

The inventors have found that, when a so-called "concatenated" sequence is formed containing:

a sequence $u$ of $n$ binary symbols $u_i$, then an interleaved sequence $u^*$ produced according to the following rule:

$u^*(x)=u(x^e)$ modulo $x^n+1$, for any value of $e$ which is a power of 2, for which the residue of $e$ modulo $N0$ is equal to 1, then the polynomial representation of the sequence $uu^*$, defined by its polynomial representation $uu^*(x)=u(x)+x^n u^*(x)$, is divisible by $g(x)$.

In the remainder of the description, this type of interleaver and, by extension, the type of turbocoders which implement them, is termed "x to $x^e$".

The coded version of $u$ is then given by $v=[u, uu^*h/g]$, where all the components are polynomials and where, in particular, $uu^*h/g$ is also a polynomial, by virtue of the definition of $uu^*$ and the choice of $e$ as a power of 2.

It should be noted that not all the interleavers of the type "x to $x^e$" can be adopted but only those for which the residue of $e$ modulo $N0$ is equal to 1. This condition results from the fact that, in $u^*(x)$ as described in the publication by C. BERROU et al. mentioned above, each $s^*_j$ is obtained from $s_j$ by a permutation but no additional permutation replacing $s^*_j$ by $s^*_i$, with $i$ different from $j$, has the required effect that all the polynomial representations of the sequences $uu^*$ must be divisible by $g(x)$.

The efficiency R of this coding is then given by $R=n/(3n-m)$.

For example, for $N0=15$, $M=27$, $n=405$, and $g(x)=1+x+x^4$, $e=151$ (which is $2^{40}$ modulo 405) satisfies the condition $e=1$ modulo 15, whilst $e=362$ (which is equal to $2^{49}$ modulo 405) does not satisfy this condition.

Figure 2:
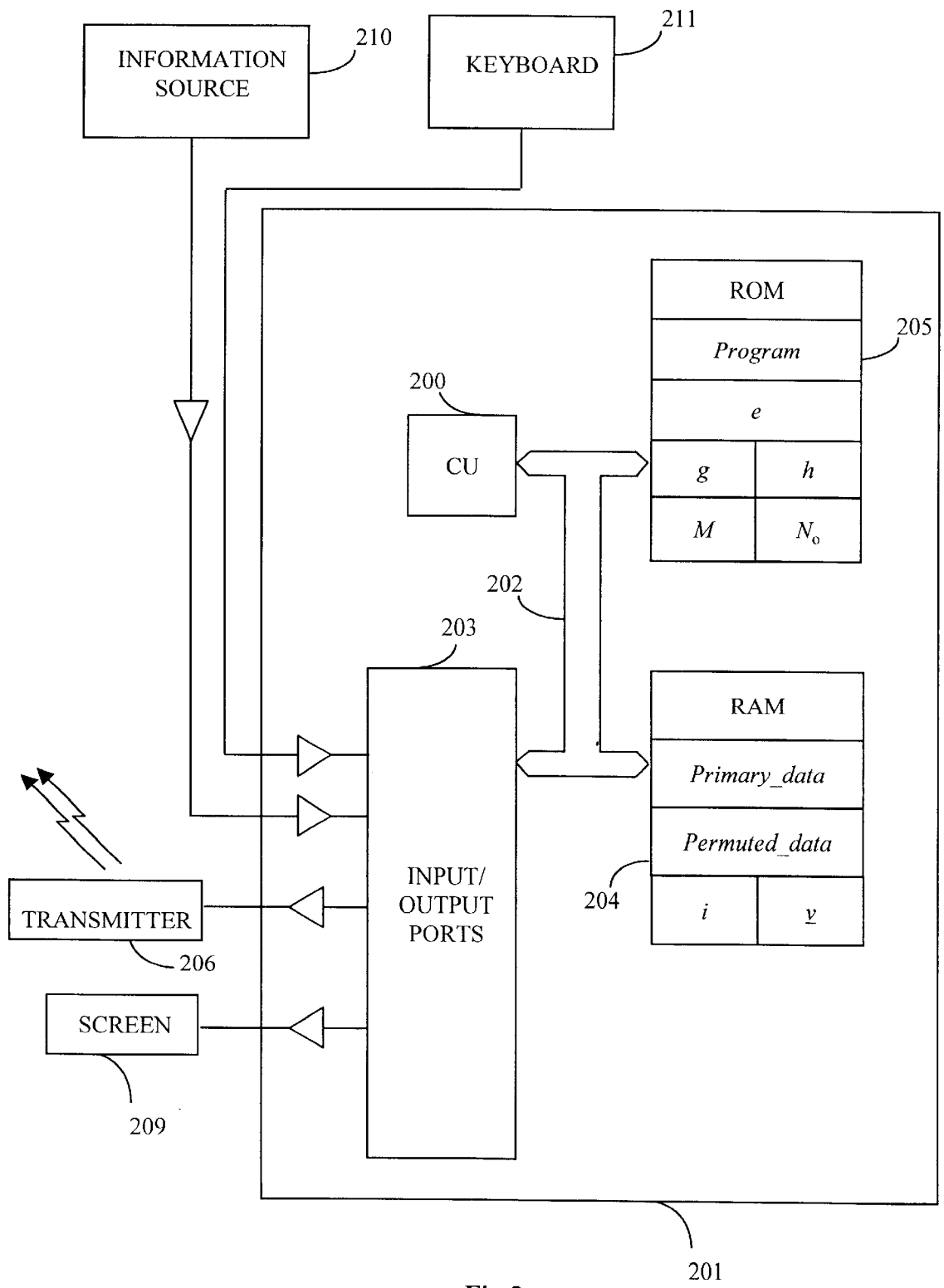
FIG. 2 depicts schematically a coding device implementing the present invention.

FIG. 2 illustrates schematically the constitution of a network station or a computer coding station, in the form of a block diagram. This station has a keyboard 211, a screen 209, an external information source 210, a radio transmitter 206, conjointly connected to an input/output port 203 of a processing card 201.

The processing card 201 has, connected together by an address and data bus 202:

a central processing unit 200;

a random access memory RAM 204;

a read only memory ROM 205; and the input/output port 203.

Each of the elements illustrated in FIG. 2 is well known to persons skilled in the art of microcomputers and transmission systems and, more generally, information processing systems. These common elements are therefore not described here. It should be noted, however, that:

the information source 210 is for example an interface peripheral, a sensor, a demodulator, an external memory or other information processing system (not shown), and is preferentially adapted to supply sequences of signals representing speech, service messages or multimedia data, in the form of binary data sequences, the radio transmitter 206 is adapted to use a packet transmission protocol on a wireless channel, and to transmit these packets on such a channel.

It should also be noted that the word "register" used in the description designates, in each of the memories 204 and 205, both a memory area of a low capacity (a few binary data) and a memory area with a large capacity (enabling an entire program to be stored).

The random access memory 204 stores data, variables and intermediate processing results, in memory registers bearing, in the description, the same names as the data whose values they store. The random access memory 204 contains notably:

a register "i" in which there is stored the value of an intermediate processing variable i, a register "primary_data" in which there are stored, in the order of their arrival on the bus 202, the binary data coming from the information source 210, in the form of a sequence u, a register "permuted_data" in which there are stored, in the order of their arrival on the bus 202, the permuted binary data, as described with regard to FIG. 2, in the form of a sequence $u^*$, and a register "v" in which there are stored, in the order of their determination by the central unit 200, the binary data of the sequence resulting from the turbocoding.

The read only memory 205 is adapted to store, in registers which, for convenience, have the same names as the data which they store:

the operating program of the central processing unit 200, in a register "program", the sequence g, in a register "g", the sequence h, in a register "h", the value of N0, in a register "N0", the value of M, in a register "M", and the value of e, a power of 2 different from 1, for which the residue of e modulo N0 is equal to 1, defining the interleaver of the type "x to $x^e$", in a register "e".

Figure 3:
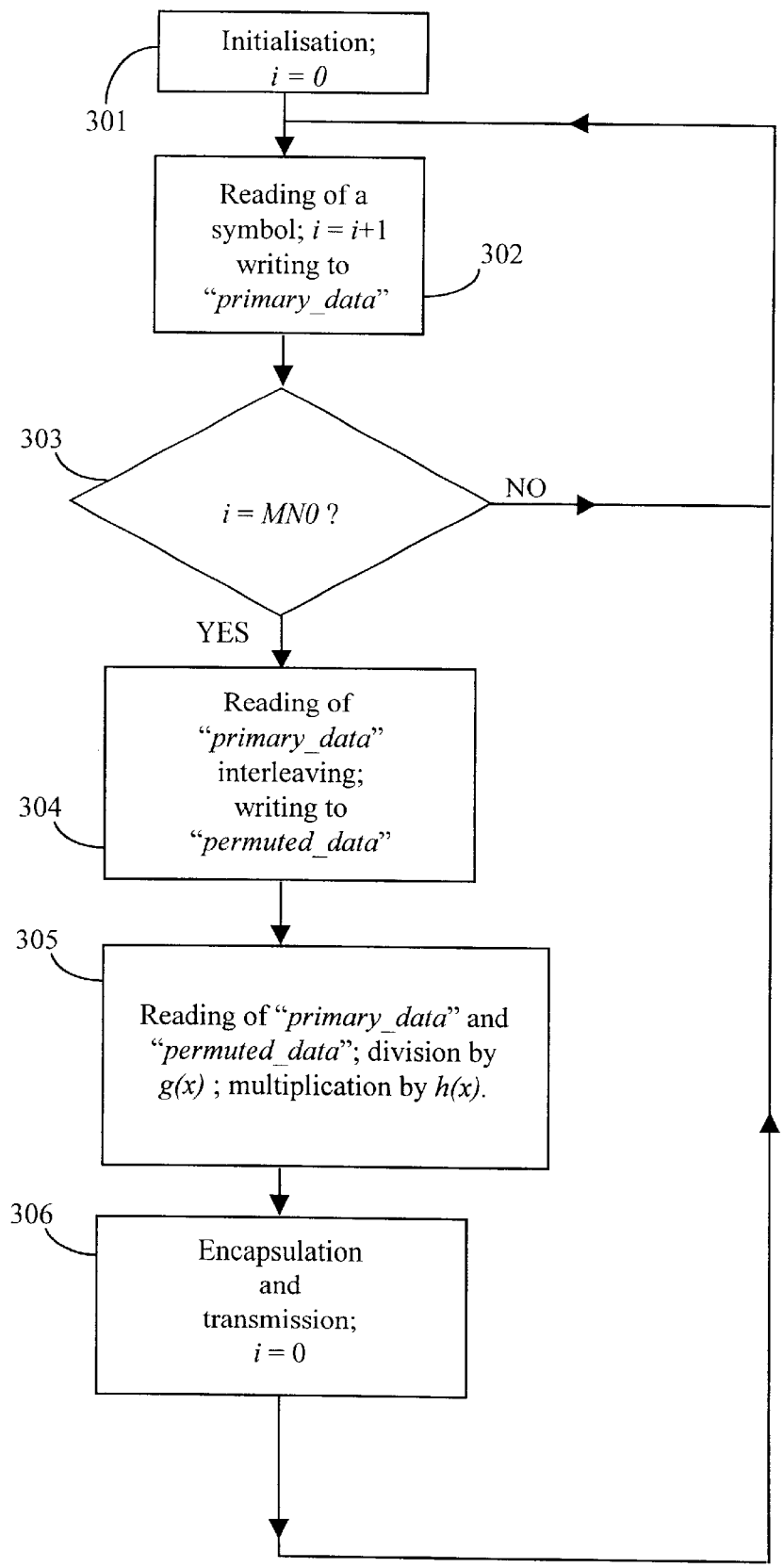
FIG. 3 depicts schematically an operating algorithm of the device illustrated in FIG. 2.

The central processing unit 200 is adapted to implement the flow diagram described in FIG. 3.

As a variant, the operating program of the central processing unit 200 may be stored in a removable storage means, such as a floppy disk, a CD-ROM, a DVD, a memory card, or any other removable storage means.

In FIG. 3, which depicts the functioning of a coding device as illustrated in FIG. 2, it can be seen that, after an initialisation operation 301 of a type known in microprocessor information storage systems, in the course of which an intermediate processing variable i is initialised to the value 0, the central unit 200 performs an operation 302 of reading an information symbol to be coded, in the information source 210. The central unit 200 puts said information symbol in a register "primary_data" of the random access memory 204 and increments the value of the variable i.

Next, during a test 303, the central unit 200 determines whether or not the value of the variable i is M·N0.

When the result of test 303 is negative, operation 302 is reiterated. When the result of test 303 is positive, during an operation 304, the data stored in the register "primary_data" are read in the order given by the rule according to which the position of the first data item read is the first position in the register "primary_data" and then the next data item read is the one which is situated at the position of the data item which has just been read plus the number e, this position being calculated modulo M·N0, then the following data item which is read is the one which is situated at the position of the data item which has just been read plus the number e, this position being calculated modulo M·N0, and so on.

During operation 304, the data read out of the register "primary_data" are successively written, in their order of reading at the successive positions in the register "permuted_data", and form the permuted sequence u*.

Next, during an operation 305, the data stored in the registers "primary_data" and permuted data are successively read, in the order of their positions in these registers, in order to form the concatenated sequence uu* by dividing their polynomial representation uu*(x) by a divisor polynomial g(x) and multiplying by a multiplier polynomial h(x). The coded sequence, v=uu* h/g, is placed in the register "v".

Next, during an operation 306, the sequence u and the coded sequence v are encapsulated in a radio frame, modulated and transmitted over a wireless transmission channel.

Finally, the variable i is reinitialised to zero and operation 302 is reiterated.

For implementing the decoding, a person skilled in the art can refer to the publication by C. BERROU mentioned in the preamble, knowing that, in accordance with the present invention, this method 1/ takes into account:
   a polynomial without square g(x),
   N0, the smallest integer such that g(x) is a divisor of the polynomial $x^{N0}+1$;
   n, an odd multiple of N0;
   e, a power of 2 different from 1, for which the residue of e modulo N0 is equal to 1, 2/ includes an operation of receiving signals representing:
   a coded sequence u of n symbols $u_i$; and
   the result of the division by g(x) of a so-called "concatenated" sequence uu* consisting successively, on the one hand, of the sequence of symbols u, including n symbols, and on the other hand a sequence of symbols u* defined by its polynomial representation, $u^*(x)=u(x^e)$ modulo $x^n+1$, and 3/ includes a decoding operation including the use of the polynomial g(x).

Figure 4:
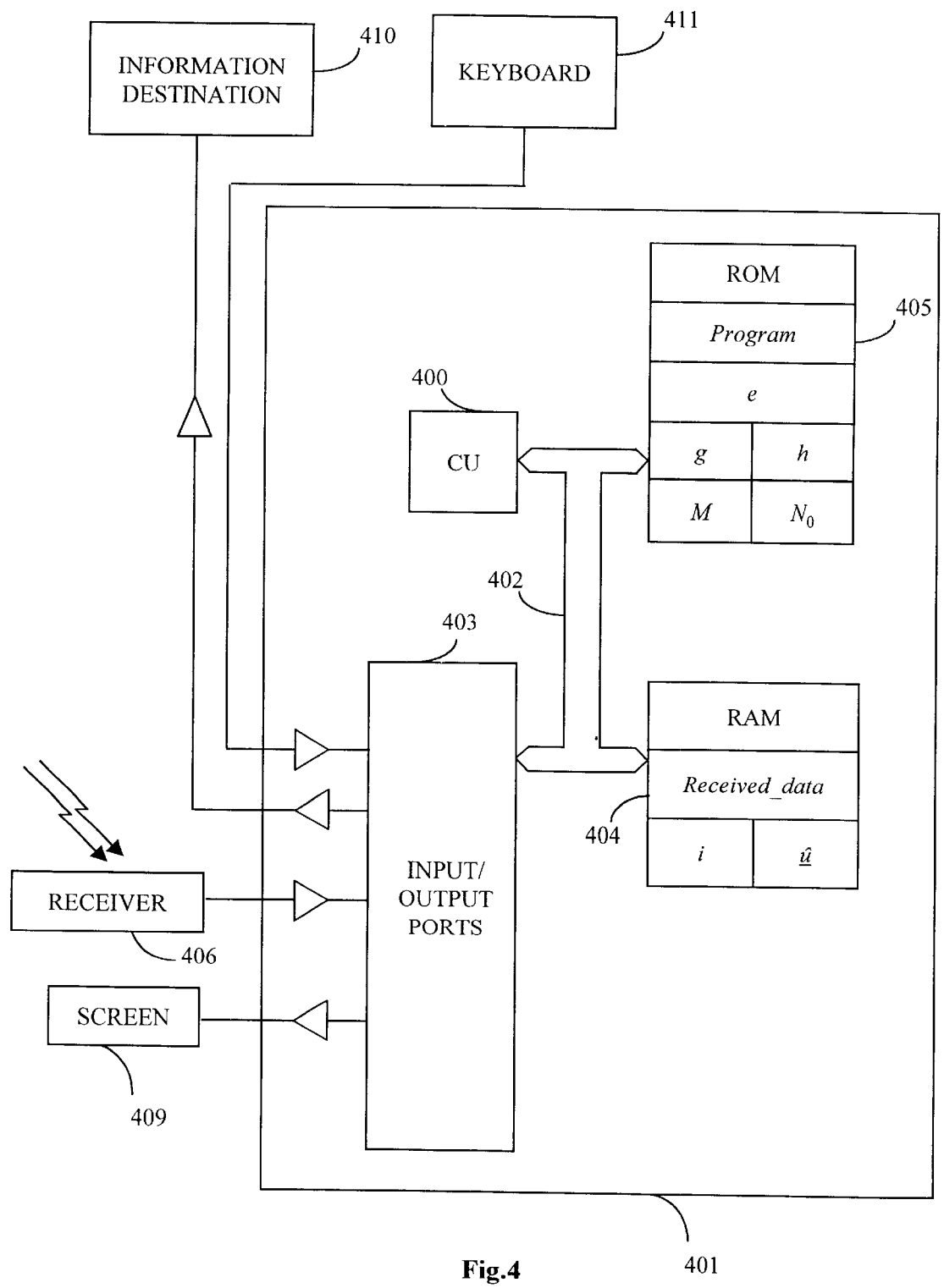
FIG. 4 depicts schematically a decoding device implementing the present invention.

FIG. 4 illustrates schematically the constitution of a network station or a computer decoding station, in the form of a block diagram. This station has a keyboard 411, a screen 409, an external information destination 410, a radio receiver 406, conjointly connected to an input/output port 403 of a processing card 401.

The processing card 401 has, connected together by an address and data bus 402:
   a central processing unit 400;
   a random access memory RAM 404;
   a read only memory ROM 405; and
   the input/output port 403.

Each of the elements illustrated in FIG. 4 is well known to persons skilled in the art of microcomputers and transmission systems and, more generally, information processing systems. These common elements are therefore not described here. It should be noted, however, that:
   the information destination 410 is for example an interface peripheral, a sensor, a demodulator, an external memory or other information processing system (not shown), and is preferentially adapted to receive sequences of signals representing speech, service messages or multimedia data, in the form of binary data sequences,
   the radio receiver 406 is adapted to use a packet transmission protocol on a wireless channel, and to transmit these packets on such a channel.

It should also be noted that the word "register" used in the description designates, in each of the memories 404 and 405, both a memory area of a low capacity (a few binary data) and a memory area with a large capacity (enabling an entire program to be stored).

The random access memory 404 stores data, variables and intermediate processing results, in memory registers bearing, in the description, the same names as the data whose values they store. The random access memory 404 contains notably:
   a register "i" in which there is stored the value of an intermediate processing variable i,
   a register "received_data" in which there are stored the binary data coming from the coding and transmission device via the radio receiver 406, in the form of a coded sequence u of n symbols $u_i$, and
   a register "û" in which there are stored the binary data of the sequence resulting from the decoding.

The read only memory 405 is adapted to store, in registers which, for convenience, have the same names as the data which they store:
   the operating program of the central processing unit 400, in a register "program",
   the sequence g, in a register "g",
   the sequence h, in a register "h",
   the value of N0, in a register "N0",
   the value of M, in a register "M", and
   the value of e, a power of 2 different from 1, for which the residue of e modulo N0 is equal to 1, defining the interleaver of the type "x to $x^e$", in a register "e".

Figure 5:
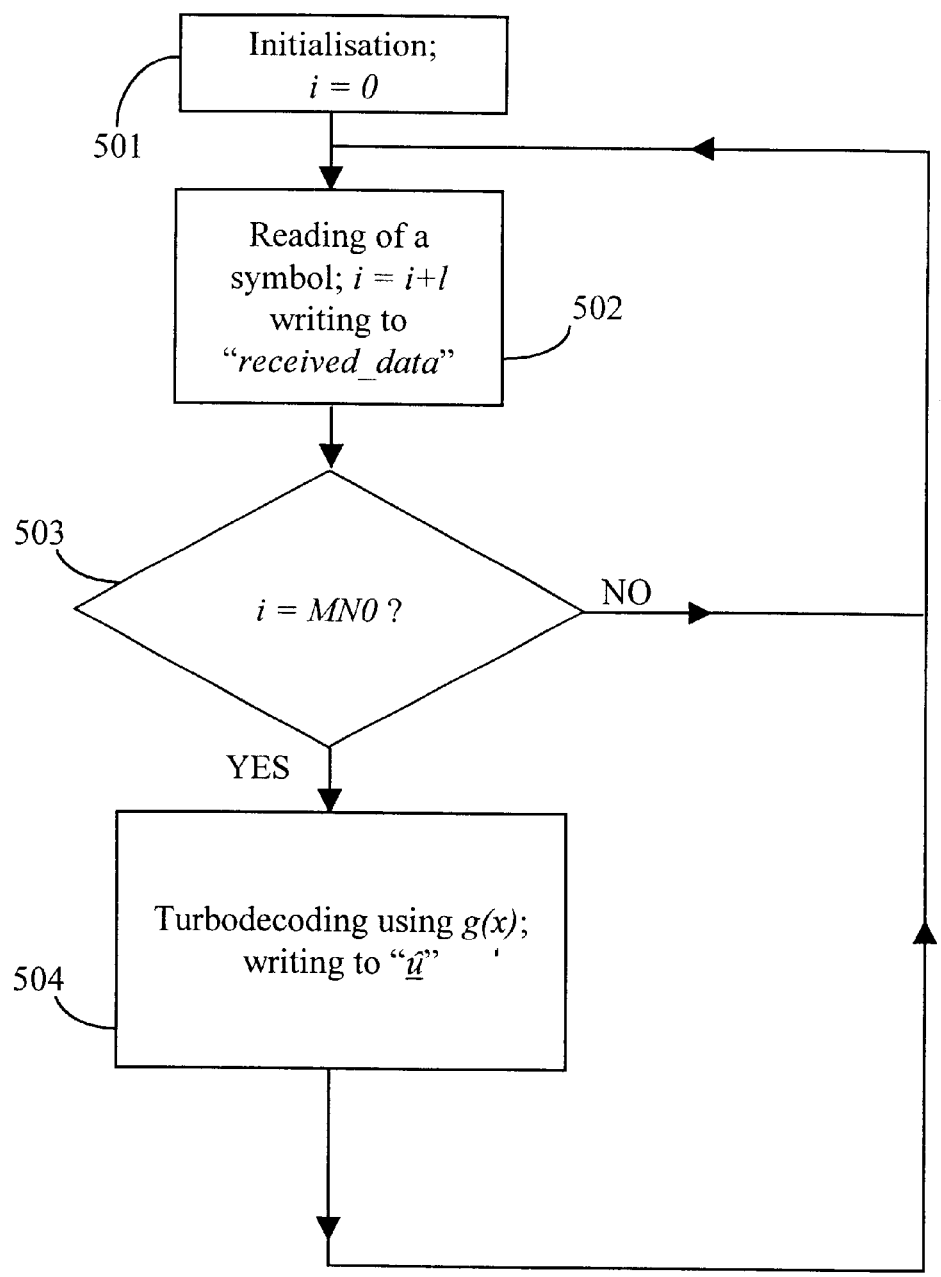
FIG. 5 depicts schematically an operating algorithm of the device illustrated in FIG. 4.

The central processing unit 400 is adapted to implement the flow diagram described in FIG. 5.

As a variant, the operating program of the central processing unit 400 may be stored in a removable storage means, such as a floppy disk, a CD-ROM, a DVD, a memory card, or any other removable storage means.

In FIG. 5, which depicts the functioning of a decoding device as illustrated in FIG. 4, it can be seen that, after an initialisation operation 501 of a type known in microprocessor information storage systems, in the course of which an intermediate processing variable i is initialised to the value 0, the central unit 400 performs an operation 502, during which the central unit 400 reads an information symbol transmitted to it by the coding and transmission device, via the radio receiver 406. The central unit 400 puts said information symbol in a register "received_data" of the random access memory 404 and increments the value of the variable i.

Next, during a test 503, the central unit 400 determines whether or not the value of the variable i is M·N0.

When the result of test 503 is negative, operation 502 is reiterated. When the result of test 503 is positive, during an operation 504, the data stored in the register "received_data" are decoded by means of a conventional turbodecoding algorithm, using the polynominal g(x), so as to obtain a sequence û of decoded binary data, corresponding to the original sequence u.

During operation 504, the decoded data are successively written in the register û in the RAM 404.

Finally, the variable i is reinitialised to zero and operation 502 is reiterated.

What is claimed is:

1. A coding method, which takes into account:
   a polynomial without square g(x),
   N0, the smallest integer such that g(x) is a divisor of the polynomial $x^{N0}+1$,
   n, an odd multiple of N0,
   a sequence u of n symbols $u_j$, to be coded, and
   e, a power of 2 different from 1, for which the residue of e modulo N0 is equal to 1,
   the method comprising:
      an operation of forming a concatenated sequence uu* by using the sequence of symbols u, having n symbols, and a sequence of symbols u* defined by its polynomial representation $u^*(x)=u(x^e)$ modulo $x^n+1$; and
      an operation of coding the concatenated sequence uu*, including at least one division of the concatenated sequence uu* by the polynomial g(x) in order to form a check sequence.

2. The coding method according to claim 1, including an operation of transmitting the sequence to be coded u and the check sequence resulting from the operation of coding the concatenated sequence.

3. The coding method according to claim 1, including an operation of transmitting the sequence to be coded u and part of the check sequence resulting from the operation of coding the concatenated sequence.

4. An information storage means which can be read by a computer or a microprocessor storing instructions of a computer program, implementing a coding method according to any one of claims 1 to 3.

5. A partially or totally removable information storage means which can be read by a computer or a microprocessor storing instructions of a computer program, implementing a coding method according to any one of claims 1 to 3.

6. A decoding method, which takes into account:
   a polynomial without square g(x),
   N0, the smallest integer such that g(x) is a divisor of the polynomial $x^{N0}+1$,
   n, an odd multiple of N0, and
   e, a power of 2 different from 1, for which the residue of e modulo N0 is equal to 1,
   the method including an operation of receiving signals representing:
      a coded sequence u of n symbols $u_j$; and
      the result of the division by g(x) of a concatenated sequence uu* by using the sequence of symbols u, including n symbols, and a sequence of symbols u* defined by its polynomial representation, $u^*(x)=u(x^e)$ modulo $x^n+1$, and
   the method further including a decoding operation of said received signals including the use of the polynomial g(x).

7. An information storage means which can be read by a computer or a microprocessor storing instructions of a computer program, implementing a decoding method according to claim 6.

8. A partially or totally removable information storage means which can be read by a computer or a microprocessor storing instructions of a computer program, implementing a decoding method according to claim 6.

9. A coding device, having a processing means adapted to take into account:
   a polynomial without square g(x),
   N0, the smallest integer such that g(x) is a divisor of the polynomial $x^{N0}+1$,
   n, an odd multiple of N0,
   a sequence u of n symbols $u_j$, to be coded, and
   e, a power of 2 different from 1, for which the residue of e modulo N0 is equal to 1, the coding device adapted:
      to form a concatenated sequence uu* by using the sequence of symbols u, including n symbols, and a sequence of symbols u* defined by its polynomial representation $u^*(x)=u(x^e)$ modulo $x^n+1$, and
      to code the concatenated sequence by effecting at least one division of the concatenated sequence uu* by the polynomial g(x) in order to form a check sequence.

10. The coding device according to claim 9, having a transmission means adapted to transmit the sequence to be coded u and the check sequence resulting from the coding of the concatenated sequence uu*.

11. The coding device according to claim 9, having a transmission means adapted to transmit the sequence to be coded u and part of the check sequence resulting from the operation of coding the concatenated sequence uu*.

12. A data transmission device including a transmitter transmitting on a wireless channel, including a coding device according to any one of claims 9 to 11.

13. A device for processing sequences of signals representing at most one thousand binary data, including a coding device according to any one of claims 9 to 11.

14. A network station, having a coding device according to any one of claims 9 to 11.

15. A decoding device, having a processing means adapted to take into account:
   a polynomial without square g(x),
   N0, the smallest integer such that g(x) is a divisor of the polynomial $x^{N0}+1$,
   n, an odd multiple of N0, and
   e, a power of 2 different from 1, for which the residue of e modulo N0 is equal to 1,
   the decoding device further comprising means for receiving signals representing:
      a coded sequence u of n symbols $u_j$; and
      the result of the division by g(x) of a concatenated sequence uu* by using the sequence of symbols u, including n symbols, and a sequence of symbols u* defined by its polynomial representation $u^*(x) = u(x^e)$ modulo $x^n+1$, wherein the processing means is adapted to decode the sequence u using the polynomial $g(x)$.

16. A device for processing signals representing speech, including a coding device, having a processing means adapted to take into account:

a polynomial without square $g(x)$,

N0, the smallest integer such that $g(x)$ is a divisor of the polynomial $x^{N0}+1$, n, an odd multiple of N0, a sequence u of n symbols $u_i$ to be coded, and e, a power of 2 different from 1, for which the residue of e modulo N0 is equal to 1, the coding device adapted:

to form a concatenated sequence uu* by using the sequence of symbols u, including n symbols, and a sequence of symbols u* defined by its polynomial representation $u^*(x)=u(x^e)$ modulo $x^n+1$, and to code the concatenated sequence by effecting at least one division of the concatenated sequence uu* by the polynomial $g(x)$ in order to form a check sequence, and further including a decoding device according to claim 15.

17. A data transmission device including a transmitter adapted to implement a packet transmission protocol, including a coding device according to any one of claims 9 to 11.

18. A data transmission device according to claim 17, wherein said protocol is the ATM (acronym for "Asynchronous Transfer Mode") protocol.

19. A data transmission device according to claim 17, wherein said protocol is the ETHERNET-type protocol.

20. A data transmission device including a transmitter adapted to implement a packet transmission protocol, including a device according to claim 15.

21. A data transmission device including a transmitter transmitting on a wireless channel, including a decoding device according to claim 15.

22. A device for processing sequences of signals representing at most one thousand binary data, including a decoding device according to claim 15.

23. A network station, having a decoding device according to claim 15.

* * * * *

UNITED STATES PATENT AND TRADEMARK OFFICE
CERTIFICATE OF CORRECTION

| | | |
|---|---|---|
| PATENT NO. | : 6,638,318 B1 | |
| APPLICATION NO. | : 09/434402 | |
| DATED | : October 28, 2003 | |
| INVENTOR(S) | : Philippe Piret et al. | |

It is certified that error appears in the above-identified patent and that said Letters Patent is hereby corrected as shown below:

SHEET 3

Figure 3, "Initialisation;" should read --Initialization;--.

SHEET 5

Figure 5, "Initialisation;" should read --Initialization;--.

COLUMN 1

Line 59, "$x^i$." should read --$x^j$.--.

COLUMN 2

Line 19, "$x^i$" should read --$x^j$--;
Line 20, "i" should be deleted;
Line 25, "R=n1(3n-m)" should read --R=n/(3n-m)--;
Line 28, "summarised" should read --summarized--;
Line 61 "characterised" should read --characterized--.

COLUMN 3

Line 45, "characterised" should read --characterized--;
Line 66, "characterised In" should read --characterized in--.

COLUMN 4

Line 19, "characterised" should read --characterized--;
Line 40, "characterised" should read --characterized--;
Line 46, "ised" should read --ized--.

COLUMN 5

Line 11, "characteristic" should read --characteristics--.

COLUMN 7

Line 11, "initialisation" should read --initialization--;
Line 13, "initialised" should read --initialized--;
Line 46, "reinitialised" should read --reinitialized--.

UNITED STATES PATENT AND TRADEMARK OFFICE
CERTIFICATE OF CORRECTION

PATENT NO. : 6,638,318 B1
APPLICATION NO. : 09/434402
DATED : October 28, 2003
INVENTOR(S) : Philippe Piret et al.

It is certified that error appears in the above-identified patent and that said Letters Patent is hereby corrected as shown below:

COLUMN 9

Line 3, "initialisation" should read --initialization--;
Line 5, "initialised" should read --initialized--;
Line 23, "reinitialised" should read --reinitialized--;
Line 24, "reiterated." should read --reiterated. ¶
 The present invention is not limited to the above embodiments and various changes and modifications can be made within the spirit and scope of the present invention. Therefore to apprise the public of the scope of the present invention, the following claims are made.--

Signed and Sealed this

Thirty-first Day of July, 2007

JON W. DUDAS
*Director of the United States Patent and Trademark Office*